(12) United States Patent
Moon (10) Patent No.: US 6,727,753 B2
(45) Date of Patent: Apr. 27, 2004

(54) OPERATIONAL TRANSCONDUCTANCE AMPLIFIER FOR AN OUTPUT BUFFER

(75) Inventor: Hong-Shik Moon, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/170,815

(22) Filed: Jun. 12, 2002

(65) Prior Publication Data

US 2002/0190793 A1 Dec. 19, 2002

(30) Foreign Application Priority Data

Jun. 18, 2001 (KR) ........................... 2001-34307

(51) Int. Cl.$^7$ ................................. H03F 3/45
(52) U.S. Cl. ........................ 330/253; 330/255
(58) Field of Search ......................... 330/253, 255, 330/257, 261, 292; 327/359

(56) References Cited

U.S. PATENT DOCUMENTS

| 5,436,470 A | 7/1995 | Nakajima |
| 5,508,530 A | 4/1996 | Nakajima |
| 5,734,296 A | 3/1998 | Dotson et al. ............ 330/253 |
| 5,818,295 A | * 10/1998 | Chimura et al. ............ 327/561 |
| 5,894,236 A | * 4/1999 | Mizoguchi et al. ......... 327/108 |
| 5,907,259 A | * 5/1999 | Yamada et al. ............. 327/563 |
| 6,163,217 A | * 12/2000 | Matsubara et al. ......... 330/255 |
| 6,384,685 B1 | * 5/2002 | Juang ........................ 330/264 |

FOREIGN PATENT DOCUMENTS

| JP | 07-235844 | 9/1995 |
| JP | 11-338432 | 12/1999 |
| KR | 1999-38009 | 7/1999 |

OTHER PUBLICATIONS

Notice of Preliminary Rejection for Korean Patent Application No. 2001-34307, Jan. 29, 2003.

* cited by examiner

Primary Examiner—Henry Choe
(74) Attorney, Agent, or Firm—Marshall, Gerstein & Borun LLP (57) ABSTRACT

An operational transconductance amplifier includes a differential amplification unit adapted to generate first and second output signals through respective first and second output nodes by differentially amplifying first and second differential input signals, a driving unit adapted to charge or discharge an output load in response to the first and second output signals and a driving current control unit adapted to control the driving current of the driving unit in response to the first output signal.

30 Claims, 9 Drawing Sheets

OPERATIONAL TRANSCONDUCTANCE AMPLIFIER FOR AN OUTPUT BUFFER

BACKGROUND

1. Technical Field

An operational transconductance amplifier for an output buffer that improves the current sourcing and sinking drivability for an output load is disclosed.

2. Description of Related Technology

As is well known, an operational amplifier may be connected as a buffer that enables analog signals to be input to the buffer output or driven into greater loads than would otherwise be possible without the buffer.

Figure 1:
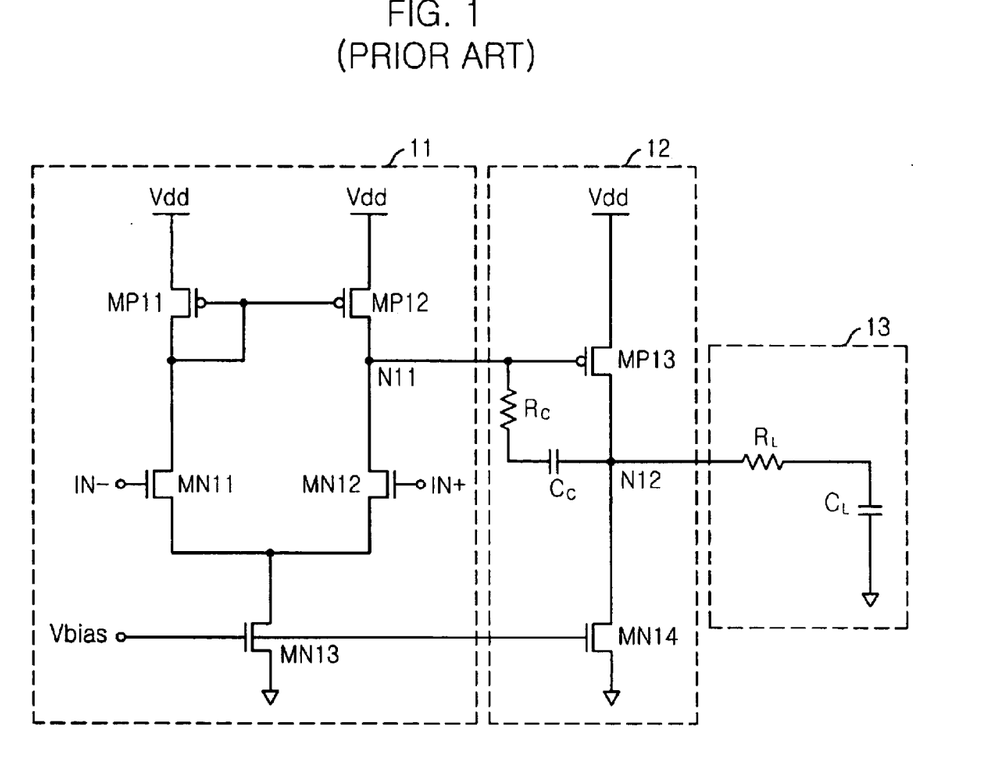
FIG. 1 is an exemplary circuit diagram that depicts a conventional two-stage operational amplifier that may be used within an output buffer.

FIG. 1 is an exemplary circuit diagram that depicts a conventional two-stage operational amplifier that may be used in an output buffer. As shown in FIG. 1, the conventional two-stage operational amplifier includes a differential amplification unit 11, a driving unit 12 and an output load 13. The differential amplification unit 11 receives a pair of differential input signals (IN+ and IN−) and differentially amplifies the received differential input signals. The driving unit 12 drives the output load 13 connected with an output node N12 according to the output signals of the differential amplification unit 11 and a bias voltage Vbias.

The differential amplification unit 11 includes a pair of PMOS transistors MP11 and MP12 that are used to provide an active load, a pair of NMOS transistors MN11 and MN12, having respective gates to which a pair of differential input signals (IN+ and IN−) are applied and an NMOS transistor MN13, to which uniform bias voltage Vbias is applied.

The driving unit 12 includes a PMOS transistor MP13 that functions as a current source and an NMOS transistor MN14 for current sinking. A gate terminal of the PMOS transistor MP13 is connected to an output node N11 of the differential amplification unit 11. The transistor MP13 functions to charge the output load 13 connected to the output node N12 of operational amplifier. The NMOS transistor MN14 functions to discharge the output load 13 connected to the output node N12 using the bias voltage Vbias, which is connected to a gate terminal of the transistor MN14. The output load 13 includes a capacitor CL and a resistor RL, both of which are connected to the output node N12.

In operation, the differential amplification unit 11 receives a pair of differential input signals (IN+ and IN−) and differentially amplifies the received signals and generates output signals having a predetermined level. When the driving unit 12 sources current to the output load unit 13, the PMOS transistor MP13 is turned on in response to a signal provided by the node N11 of the differential amplification unit 11, thereby enabling the output load 13 to be charged. On the other hand, to discharge the output load 13, the PMOS transistor MP13 is turned off and the NMOS transistor MN14 is turned on by the bias voltage Vbias.

When considering the current drivability of output load in the conventional two-stage operational amplifier, a drivability of the PMOS transistor MP13 for sourcing current is typically sufficient to charge the output load 13. However, the drivability of NMOS transistor MN14 for sinking current to discharge the output load 13 is typically limited a quiescent current state. Namely, because a fixed bias voltage Vbias is applied to a gate of the NMOS transistor MN14 to supply bias current to the differential amplification unit 11, the drivability (i.e., the current drive capability) is much lower than the current source PMOS transistor MP13. Thus, to more rapidly discharge the output load unit 13, the quiescent current of the NMOS transistor MN14 must be increased. Unfortunately, increasing quiescent current in this manner increases static power consumption of the operational amplifier.

In the case of an LCD source driver for driving each display pixel, an output buffer such as that shown in FIG. 1 may be used for each pixel. However, the amplifier shown in FIG. 1 cannot be applied to the LCD source driver due to its excessive power consumption.

Figure 2:
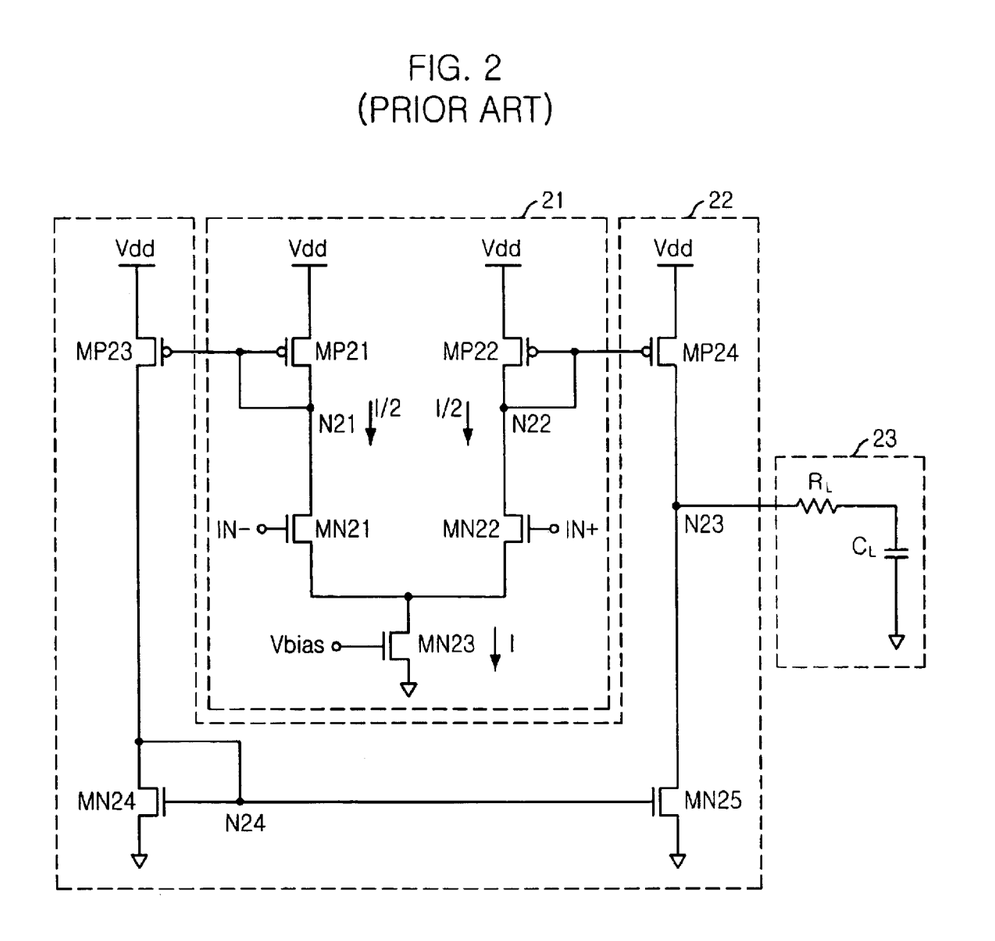
FIG. 2 is an exemplary circuit diagram that depicts a conventional one-stage operational transconductance amplifier.

FIG. 2 is an exemplary circuit diagram showing a conventional one-stage operational transconductance amplifier. As shown in FIG. 2, the conventional one-stage operational transconductance amplifier includes a differential amplification unit 21, a driving unit 22 and an output load 23. The differential amplification unit 21 receives a pair of differential input signals (IN+ and IN−) and differentially amplifies the received differential input signals (IN+ and IN−). The driving unit 22 drives the output load 23, which is connected to an output node N23, by a first output signal and a second output signal of a first output node N21 and a second output node N22, respectively, in the differential amplification unit 21.

The configuration of the differential amplification unit 21 is generally similar to the differential amplification unit 11 shown in FIG. 1. In FIG. 1, the gates of the PMOS transistors MP11 and MP12, which are passive loads, are connected to each other and to a drain of the NMOS transistor MN11. On the other hand, in the differential amplification unit 21 shown in FIG. 2, the gates of PMOS transistors MP21 and MP22 are connected to the drains of NMOS transistors MN21 and MN22, respectively, and the drains form a first output node N21 and a second output node N22, respectively.

The driving unit 22 includes a PMOS transistor MP24 for sourcing current to charge the output load 23 in response to the second output signal of the second output node N22 in the differential amplification unit 21, a PMOS transistor MP23 and an NMOS transistor MN24 to supply bias current for current sinking in response to the first output signal of the first output node N21 in the differential amplification unit 21 and an NMOS transistor MN25, which is driven by the current supplied through the PMOS transistor MP23 and the NMOS transistor MN24, for sinking current to discharge the output load 23. The output load 23, which is identical to the output load 13 as shown in FIG. 1, includes a capacitor (CL) and resistance (RL).

In operation, the differential amplification unit 21 receives a pair of differential input signals (IN+ and IN−) and differentially amplifies the received input signals and then the first and the second output signals are output through the first and second output nodes N21 and N22. To source current to the output load 23, the PMOS transistor MP24 is turned on in response to the second output signal outputted through the second output node N22 in the differential amplification unit 21.

To sink current from the output load 23, a current mirror is formed at the PMOS transistor MP23, having a gate to which the first output signal of the first output node N21 in the differential amplification unit 21 is applied, with the PMOS transistor MP21 in the differential amplification unit 21 and the current flows into the NMOS transistor MN25 for current sinking through the NMOS transistor MN24.

Accordingly, in the conventional one-stage operational transconductance amplifier, as the NMOS transistor MN25 for sinking current and the PMOS transistor MP24 for sourcing current are driven in response to the output signals of the first and second output nodes N21 and N22, respectively, the current I/2 flowing through the PMOS transistor MP24 increases in proportion to the size ratio of the PMOS transistors MP24 and MP22.

Generally speaking, it is advantageous that the drivability for sourcing current and the drivability for sinking current of the output load 23 in the conventional operational transconductance amplifier are identical. However, there is a problem that the maximum driving current of the PMOS transistor MP24 for sourcing current and the NMOS transistor MN25 for sinking current of output the load 23 is limited to two times the quiescent state current.

Because the uniform bias voltage Vbias is applied to the gate of the NMOS transistor MN23 in the differential amplification unit 21, current I always flows at the NMOS transistor MN23 so that a current I/2 flows through each of the NMOS transistors MN21 and MN22 in the quiescent state.

The current I/2 for each PMOS transistor MP24 and NMOS transistor MN25 increases in proportion to the size ratio of the PMOS transistors MP24 and MP22 and a size ratio of the NMOS transistors MN25 and MN24 by a current mirror. Alternatively, when current I flows through only one of the NMOS transistors MN21 or MN22, the current I of the PMOS transistor MP23 or the NMOS transistor MN25 increases in proportion to a size ratio of the PMOS transistors MP24 and MP22 and a size ratio of the NMOS transistors MN25 and MN24 so that the maximum driving current is two times the quiescent state current.

The conventional one-stage operational amplifier has a low gain characteristic due to a one-stage structure and the fact that it has identical current sinking and current sourcing drive capability. However, the maximum driving current is limited to two times the quiescent state current. Because the quiescent current must be increased to drive a large capacitive load, which undesirably increases power consumption.

Figure 3:
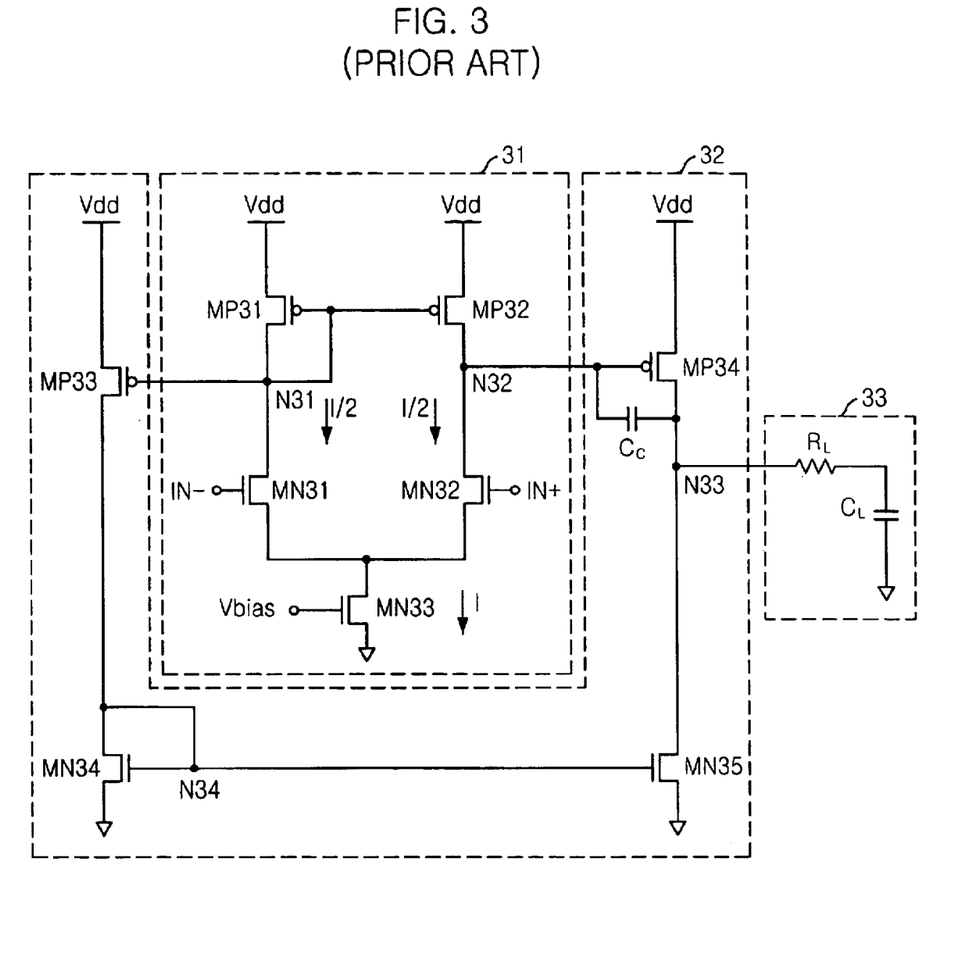
FIG. 3 is an exemplary circuit diagram that depicts a conventional push-pull operational amplifier that may be used to drive a large capacitive load.

FIG. 3 is an exemplary circuit diagram that depicts a conventional push-pull operational amplifier that may be used for driving a large capacitive load. As shown in FIG. 3, the conventional push-pull operational amplifier includes a differential amplification unit 31 for receiving a pair of differential input signals IN+ and IN− and differentially amplifies the differential input signals. The push-pull amplification unit 31 also includes a driving unit 32 for driving an output load 33, which is connected to an output node N33, in response to first and a second output signals of first and second output nodes N31 and N32.

The differential amplification unit 31 is similar to the differential amplification units 11 and 21 shown in FIGS. 1 and 2. In the conventional push-pull operational amplifier, gates of the PMOS transistors MP31 and MP32 are connected to each other and joined to a drain of the PMOS transistor MP31. Drains of the PMOS transistors MP31 and MP32 are represented as the first and second output nodes N31 and N32, respectively.

The driving unit 32 includes a PMOS transistor MP34 for current sourcing, a PMOS transistor MP33 and an NMOS transistor MN34 for supplying bias current and an NMOS transistor MN35 for current sinking. The PMOS transistor MP34 for current sourcing charges the output load 33 in response to the second output signal of the second output node N31. The PMOS transistor MP33 and the NMOS transistor MN34 supply bias current in response to the first output signal of the first output node N31 in the differential amplification unit 31 and the NMOS transistor MN35 for current sinking, which is driven by the bias current supplied through the PMOS transistor MP33 and the NMOS transistor MN34, are for discharging the output load 33. The output load 33 includes a capacitor and a resistance.

In operation, the differential amplification unit 31 receives a pair of differential input signals (IN+ and IN−) and outputs first and second output signals through the first and second output nodes N31 and N32 after differentially amplifying the received differential input signals. To source current to the output load 33, the driving unit 32 drives the PMOS transistor MP34 using the output signal of the second output node N32 in the differential amplification unit 31.

On the other hand, for sinking current from the output load 33, a current mirror is formed at the PMOS transistor MP33, having a gate to which the output signal of the first output node N31 is applied. A bias current is supplied to the NMOS transistor MN35 for current sinking through the diode-connected NMOS transistor MN34 so that the output load 23 is discharged.

In the conventional push-pull operational amplifier, because the PMOS transistor MP34 for current sourcing is driven by the output signal of the second output node N32 in the same manner shown in FIG. 1, a sufficient drivability of the current source can be achieved.

The uniform bias voltage Vbias is not applied to the gate of the NMOS transistor MN35 for current sinking different from FIG. 1. The gate of the NMOS transistor MN35 is connected to the diode-connected NMOS transistor MN34. At this time, a current mirror is formed at the PMOS transistor MP33 and the diode-connected PMOS transistor MP31, which is an active load, so that a bias current is mirrored at the NMOS transistor MN35 through the NMOS transistor MN34.

Accordingly, the current of NMOS transistor MN35 for current sinking increases in proportion to the size ratio of the NMOS transistors MN35 and MN33 so that the PMOS transistor MP34 and the NMOS transistor MN35 are operated as push-pull drivers.

The above-mentioned push-pull operational amplifier has better power consumption and current drivability characteristics than the operational amplifiers shown in FIGS. 1 and 2. However, because the maximum current sinking drivability is a value multiplying a current I flowing in the NMOS transistor MN33 and a size ratio of NMOS transistors MN34 and MN35, the current sinking drivability of the NMOS transistor MN35 is lower compared with the current source drivability of the PMOS transistor MP34. So, in order to improving the current sinking drivability of the NMOS transistor MN35, the current I or the size ratio of the NMOS transistors MN35 and MN34 has to increase, which undesirably increases static power consumption.

SUMMARY OF THE DISCLOSURE

In accordance with one aspect of the disclosure, an operational transconductance amplifier may include a differential amplification unit adapted to generate a first output signal and a second output signal through first and a second output nodes by differentially amplifying first and second differential input signals, a driving unit adapted to charge or discharge an output load in response to the first and second output signals, and a driving current control unit adapted to control the driving current of the driving unit in response to the first output signal.

In accordance with another aspect of the disclosure, an operational transconductance amplifier may include a differential amplification unit for differentially amplifying first and second differential input signals and for outputting first and second output signals through first and second output nodes, a driving unit adapted to charge or discharge an output load of an output node in response to the first and the second output signals of the differential amplification unit, and a driving current control unit adapted to control a sinking current of the driving unit for discharging the output load of the output node in response to the first output signal of the differential amplification unit.

In accordance still another aspect of the disclosure, an operational transconductance amplifier may include a differential amplification unit adapted to differentially amplify first and second differential input signals and to output first and second output signals through first and second output nodes, a driving unit adapted to charge or discharge an output load of an output node in response to the first and the second output signals of the differential amplification unit, and a driving current control unit adapted to control a sourcing current of the driving unit for charging the output load of the output node in response to the first output signal of the differential amplification unit.

DETAILED DESCRIPTION OF THE PREFERRED EMBODIMENTS

Figure 4:
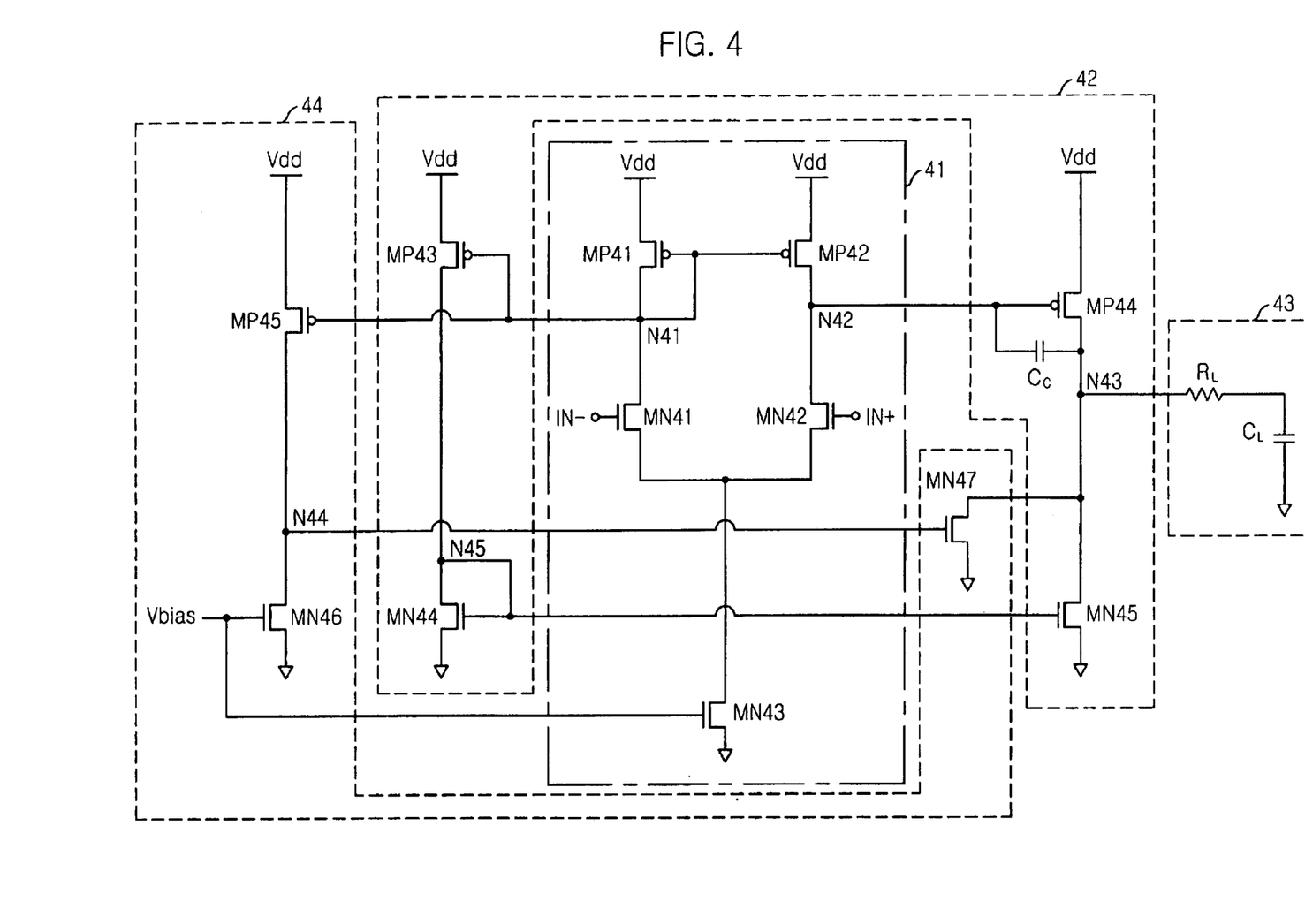
FIG. 4 is an exemplary circuit diagram that depicts an operational transconductance amplifier according to one embodiment of the disclosure.

FIG. 4 is an exemplary circuit diagram that depicts an operational transconductance amplifier according to one embodiment of the disclosure. The operational transconductance amplifier includes a differential amplification unit 41, a driving unit 42, an output load 43 and a driving current control unit 44. The differential amplification unit 41 receives a pair of differential input signals (IN+ and IN−) and differentially amplifies the received signals. The driving unit 42 drives the output load 43 connected to an output node N43 in response to a first output signal and a second output signal of a first output node N41 and a second output node N42. The driving current control unit 44 controls the sinking current between the driving currents of the driving unit 42 in response to the first output signal of the first output node N41 in the differential amplification unit 41.

The differential amplification unit 41 includes PMOS transistors MP41 and MP42, which are active loads, NMOS transistors MN41 and MN42, which have gate terminals that are connected to the differential input signals IN+ and IN−, and an NMOS transistor MN43, having a gate to which the uniform bias voltage Vbias is applied. In the differential amplification unit 41, the gates of the PMOS transistors MP41 and MP42 are connected to the drain of the PMOS transistor MP41 and the drains of the PMOS transistors MP41 and MP42 are represented as the first and second output nodes N41 and N42 of the differential amplification unit 41. The second output node N42 is a high gain node between the first and second output nodes N41 and N42 in the differential amplification unit 41.

The driving unit 42 includes a PMOS transistor MP44 for sourcing current to charge the output load 43 in response to the second output signal of the second output node N42 in the differential amplification unit 41, a PMOS transistor MP43 and an NMOS transistor MN44 to supply a bias current for sinking current in response to the first output signal of the first output node N41 in the differential amplification unit 41 and an NMOS transistor MN45 for sinking current to discharge the output load 43 by driving the bias current supplied through the PMOS transistor MP43 and the NMOS transistor MN44.

In the driving unit 42, a gate of the PMOS transistor MP43 is connected to the first output node N41 of the differential amplification unit 41 and the drain of the PMOS transistor MP43 is connected to the drain of the diode-connected NMOS transistor MN44. A gate of the PMOS transistor MP44 for sourcing current is connected to the second output node N42 of the differential amplification unit 41 and the gate of the NMOS transistor MN45 for sinking current is connected to the gate of the NMOS transistor MN44. Drains of the PMOS transistor MP44 for current sourcing and the NMOS transistor MN45 for current sinking are connected to the output node N43 of the operational amplifier. The PMOS transistor MP43 is connected with the first output node N41 of the differential amplification unit 41, thereby forming a current mirror with the PMOS transistor MP41. The driving unit 42 further comprises a compensation capacitor (Cc), which is connected to the gate and the drain of the PMOS transistor MP44 for sourcing current.

The driving current control unit 44 includes a PMOS transistor MP45, having a gate terminal to which the first output signal of the first node N41 in the differential amplification 41 is applied, an NMOS transistor MN46, having a gate to which a uniform bias voltage Vbias is applied and the drain of the PMOS transistor MP45 is connected to the drain thereof through the drain node N44 and an NMOS transistor MN47, having a gate to which a drain node N44 of the PMOS transistor MP45 and the NMOS transistor MN46 is connected.

In the driving current control unit 44, the NMOS transistor MN47 is connected parallel with the NMOS transistor MN46 for sinking current and is also connected to the drain node N44 of the NMOS transistor MN46 with the PMOS transistor MP45. When the current sinking operation is performed, the NMOS transistor MN47 functions to rapidly discharge the output load 43 with the NMOS transistor MN45 for current sinking.

In operation, the gate of the PMOS transistor MP44 for current sourcing of the output load 43 is connected to the second output node N42, which is the high gain node of the differential amplification unit 41, so that a sufficient drivability of current sourcing is achieved. The gate of the NMOS transistor MN45 for sinking current of the output load 43 is connected to the gate of the NMOS transistor MN44 through the node N45.

The gate of the PMOS transistor MP45 of the driving current control unit 44 is connected to the first output node N41 of the differential amplification unit 41 so that a current mirror is formed with the PMOS transistor MP41 of the differential amplification unit 41. The sizes of the PMOS transistors MP41 and MP45 are substantially the same and the sizes of the NMOS transistors MN43 and MN46 are substantially the same.

Figure 5:
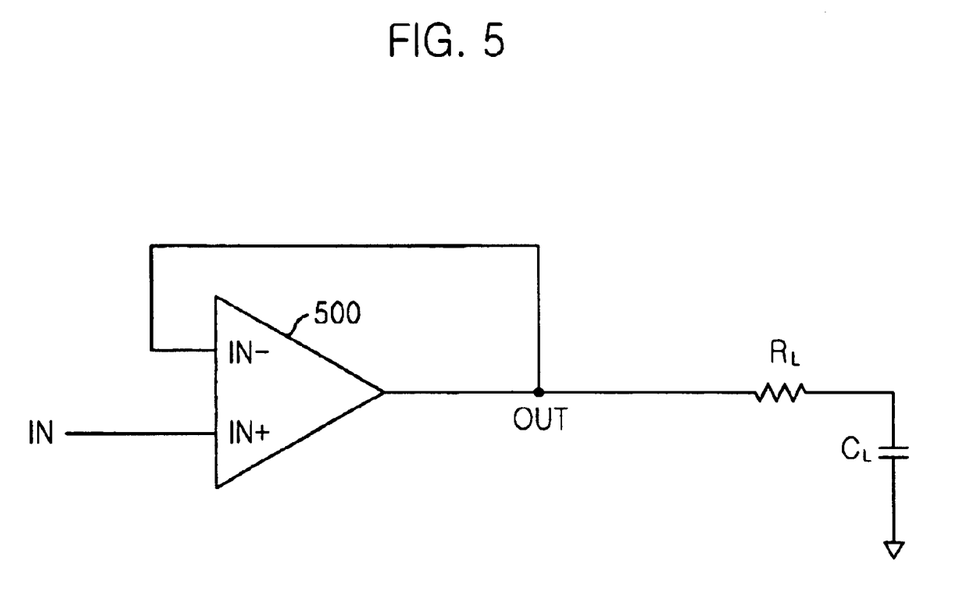
FIG. 5 is an exemplary circuit diagram that depicts an output load.

FIG. 5 is an exemplary circuit diagram showing a resistance (RL) and a capacitor (CL) as an output load driven by the output buffer 500. Generally, in case of a TFT LCD source driver IC, RL is 50 k ohms and CL is 50 pF.

The quiescent state of the amplifier 500 is a common mode state in which the non-inverting input (IN+) and the inverting input (IN−) have the same voltage level. At this time, the bias voltage is applied to the gate of the NMOS transistor MN43 so that a uniform current flows. The bias voltage is larger than threshold voltage of the NMOS transistor MN43 to maximize common mode input range of the differential amplification unit 41. For example, the bias voltage is Vth (threshold voltage) +0.2 V. Accordingly, to guarantee that the NMOS transistor MN43 is in the saturation region, the difference between the drain voltage and the source voltage of the NMOS transistor, MN43 has to be greater than Vbias−Vth. For example, when Vth is 1.0 V and the bias voltage is 1.2 V, Vds has to be greater than 0.2 V.

In the quiescent state, current I/2, which is half bias voltage, flows through the NMOS transistors MN41 and MN42. Accordingly, current I/2 flows at the PMOS transistor MP43, which has a gate terminal that is connected to the gate of the diode-connected PMOS transistor MP41 through the first output node N41. As the gate of the diode-connected NMOS transistor MN44 in the driving unit 42 is connected to the gate of NMOS transistor MN45 for current sinking, current multiplying I/2 and the size ratio of NMOS transistors MN45 and MN44 flows at the NMOS transistor MN45.

Also, in the quiescent state, because the voltage levels of the first output node N41 and the second output node N42 are substantially identical, current multiplying the size ratio of PMOS transistors MP44/MP42 and I/2 flows at the PMOS transistor MP44 for sourcing current, which is connected to the second output node N42. The sizes of the NMOS transistor MN45 and the PMOS transistor MP44 are selected to prevent generation of an input offset of system according to setting time for driving the output load 43.

Also, because the size of the PMOS transistor MP45, which has a gate terminal that is connected to the first output node N41, is identical to the PMOS transistor MP41, the current flowing at the PMOS transistor MP45 is I/2, which is identical to the current flowing through the PMOS transistor MP41.

The current I/2 flows at the NMOS transistor MN46 according to Kirchhoffs law. The size of the NMOS transistor MN46 is identical with the NMOS transistor MN43 of the differential amplification unit 41. Because the bias voltage Vbias is applied to the gate of the NMOS transistor MN46 like the NMOS transistor MN43 of the differential amplification unit 41, the current I flows when the NMOS transistor MN46 is operated at the saturation region when voltage of node N44 is 0.2 V. To cause the current I/2 to flow through the NMOS transistor MN46, the voltage of node N44, which is the Vds of the NMOS transistor MN46, is reduced below 0.2 V, thereby enabling the NMOS transistor MN46 to operate within a linear region. Because the voltage level of the node N44 is lower than the threshold voltage Vth of the NMOS transistor MN47, the NMOS transistor MN47, which has a gate terminal that is connected to the node N44, is turned off so that the current does not flow.

To source current to the output load 43, the voltage level of the input signal (IN) in FIG. 5 is transitioned from a low level to a high level so that the output load 43 is charged and the voltage level of the output load 43 is changed to a high level from a low level. At this time, the worst case is that the input signal nears or equals the maximum input signal range. When the input signal slews from a low level to high level, the voltage difference between the non-inverting input (IN+) and the inverting input (IN−) is maximized. At this time, the current I flowing at the NMOS transistor MN43 of the differential amplification unit 41 flows only through the NMOS transistor MN42, having a gate to which the non-inverting input (IN+) is applied, so that the voltage of second output node N42 of the differential amplification unit 41 drops by grounding voltage and the drivability of current source of the PMOS transistor MP44 for current source of the driving unit 42, whose gate is connected to the second output node N42, is maximized.

Because the current does not flow at the NMOS transistor MN43 of the differential amplification unit 41, the current flowing at the PMOS transistors MP41, MP43 and MP45, whose gates are connected to the first output node N41 of the differential amplification unit 41, becomes zero. Because the voltage levels of the node N44 and the node N45 are near to grounding voltage level, the NMOS transistor MN45, whose gate is connected to the node N45, and the NMOS transistor MN47, whose gate is connected to the node N44, are turned off. Therefore, because the PMOS transistor MP44 for sourcing current to the output load is connected to the second output node N42 having a high gain in the differential amplification unit 41, drivability for driving the output load 43 is sufficient.

The current sinking operation of the output load occurs when the voltage level of the input signal (IN) is transitioned into a low level from a high level. At this time, the voltage difference between the non-inverting input (IN+) node and the inverting input (IN−) node connected to the output node is maximized. The operation for sourcing current to the output load 43 is a positive slewing and the operation for sinking current from the output load 43 occurs during a negative slewing.

In the case of the current sinking operation, the current I flowing at the NMOS transistor MN43 of the differential amplification unit 41 flows only through the NMOS transistor MN41 so that the current flowing at the NMOS transistor MN42 is zero.

The gate of the PMOS transistor MP42 is connected to the gate of the diode-connected PMOS transistor MP41 and the current I flows at the PMOS transistor MP41 so that, in order that the current I flowing at the PMOS transistor becomes zero, the voltage of the second output node N42 has to increase near to Vdd. Accordingly, the PMOS transistor MP44 of the driving unit 42, whose gate is connected to the second output node N42 of the differential amplification unit 41, is turned off and the current I flowing at the NMOS transistor MN41 of the differential amplification unit 41 flows to the diode-connected NMOS transistor MN44 through the PMOS transistors MP41 and MP43. Therefore, the current multiplying the NMOS transistors' size ratio (MN45/MN44) and I flows through the NMOS transistor MN45 for current sinking connected to the node N45. Namely, the maximum sinking current of the NMOS transistor MN45 is acquired by multiplying the NMOS transistors' size ratio (MN45/MN44) and I.

In order that the driving current for current sinking of the NMOS transistor MN45 is much lower or much higher than the driving current for current source of the PMOS transistor MP44, the bias current I or the NMOS transistors' size ratio (MN45/MN44) has to be relatively large. At this time, there is a problem that the power consumption increases due to increase of static current flowing at the quiescent state.

Instead of increasing the bias current (I) or NMOS transistors' size ratio (MN45/MN44), the current sinking drivability of the NMOS transistor MN45 for current sinking can be improved by using the driving current control unit 44. Because the gate of the PMOS transistor MP45 in the driving current control unit 44 is connected to the first output node N41, the current I flowing through the diode-connected PMOS transistor MP41 flows identical with the PMOS transistor MP45. Also, the identical current I flows at the NMOS transistor MN46, which is connected in series with the PMOS transistor MP45 of the driving current control unit 44. The size of the NMOS transistor MN46 equals the size of the NMOS transistor MN43, which supplies the bias current I into the NMOS transistors MN41 and MN42 of the differential amplification unit 41. Also, the bias voltage Vbias is applied to the gate of the NMOS transistor MN46. A voltage level of the node N44 becomes a high voltage level for sufficiently operating the NMOS transistor MN46 at the saturation region.

Because the PMOS transistor MP45 and the NMOS transistor MN46, which are connected in series to a path between the power (Vdd) and the ground, are operated in the saturation region, the voltage level of the node N44 can increase by about Vdd/2 level so that the NMOS transistor MN47, which the gate is connected to the node N44, is turned on. Accordingly, a sufficient current sinking drivability is provided and the output load is rapidly discharged.

When the voltage of the output node (OUT) becomes near to the input voltage (IN), the current flowing at the PMOS transistor MP45 of the driving current control unit 44 nearly equals to the current of the quiescent state. The voltage of the node N44 decreases under the threshold voltage (Vth) of the NMOS transistor MN45 so that the NMOS transistor MN47 is turned off. The output voltage is settled to the input voltage by the NMOS transistor MN45 successively performing the current sinking operation.

When the signal applied to the non-inverting input (IN+) in FIG. 5 is transitioned from a high level to a low level, that is, when the voltage level applied to the non-inverting input stage (IN+) is lower than the voltage level applied to the inverting input stage (IN−) connected to the output stage (OUT), the NMOS transistor MN47 of the driving current control unit 44 is turned on so that the insufficient current sinking drivability is improved and the voltage of the output node is settled to the voltage of the non-inverted input stage (IN+) in the desired time.

The size of the NMOS transistor MN47 is determined by the capacitive output node and the desired settling time. Because the static current does not flow into the NMOS transistor MN47, a power consumption due to increase of a size of the NMOS transistor MN47 does not increase.

Thus far, the operational amplifier has been described for the case that the NMOS transistors MN41 and MN42 are used as the input stages of the differential input stages. However, when PMOS transistors are used as the input stages, the same effects are expected.

Figure 6:
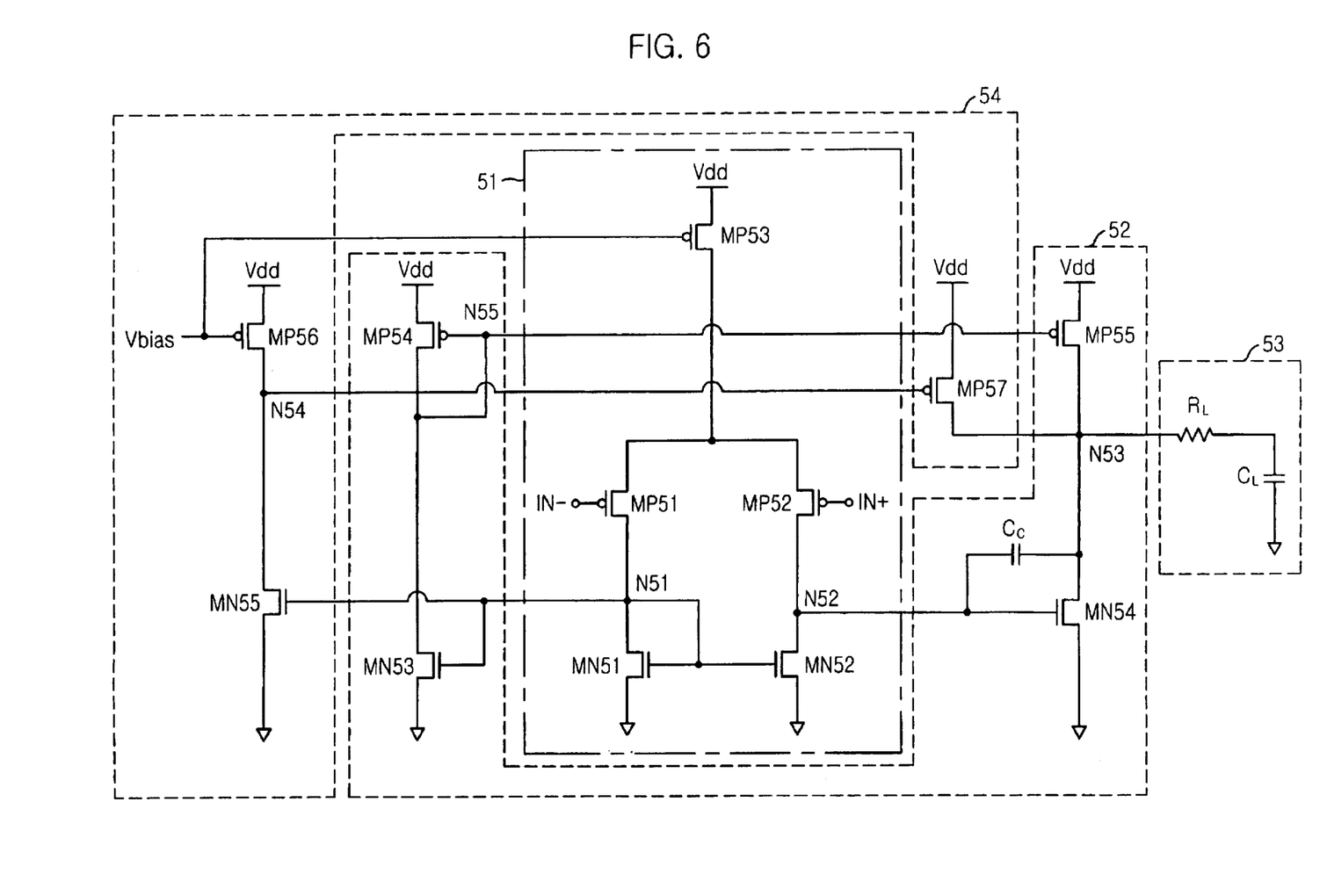
FIG. 6 is an exemplary circuit diagram that depicts an operational transconductance amplifier according to another embodiment of the disclosure.

FIG. 6 is an exemplary circuit diagram that depicts an operational transconductance amplifier according to another embodiment of the disclosure that uses PMOS transistors in the input stage. As shown in FIG. 6, the operational transconductance amplifier includes a differential amplification unit 51, a driving unit 52 and a driving current control unit 54. The differential amplification unit 51 receives a pair of differential input signals (IN+ and IN−) and differentially amplifies the received differential input signals. The driving unit 52 drives an output load 53 connected to an output node N53 in response to a first output signal and a second output signal of a first output node N51 and a second output node N52 in the differential amplification unit 51. The driving current control unit 54 controls a sourcing current in response to the first output signal of the first output node N51 in the differential amplification unit 51.

The differential amplification unit 51 includes PMOS transistors MP51 and MP52, having gates to which the differential input signals (IN+ and IN−) are applied, and a PMOS transistor MP53, having a gate to which uniform bias voltage Vbias is applied.

In the differential amplification unit 51, the gates of the NMOS transistors MN51 and MN52 are identically connected to the drain of the NMOS transistor MN51 and the drains of the NMOS transistor MN51 and the NMOS transistor MN52 correspond to the first and second output node N51 and N52 of the differential amplification unit 51. The second output node N52 is a high gain node.

The driving unit 52 includes an NMOS transistor MN54 for current sinking to discharge the output load 53 in response to the second output signal of the second output node N52 in the differential amplification unit 51, a PMOS transistor MP54 and an NMOS transistor MN53 for supplying the bias current for current sinking in response to the first output signal of the first output node N51 in the differential amplification unit 51 and a PMOS transistor MP55 for current sourcing to charge the output load 53 driven by the bias current supplied by the PMOS transistor MP54 and the NMOS transistor MN53.

In driving unit 52, the gate of the NMOS transistor MN53 is connected to the first output node N51 of the differential amplification unit 51 and the drain of the NMOS transistor MN53 is connected to the drain of the diode-connected PMOS transistor MP54. The gate of the NMOS transistor MN54 for current sinking is connected to the second output node N52 of the differential amplification unit 51 and the gate of the PMOS transistor MP55 for current sourcing is connected to the gate of the PMOS transistor MP54 through the node N55. Drains of the PMOS transistor MP55 for current sourcing and the NMOS transistor MN54 for current sinking are connected to the output node N53 of the operational amplifier.

The NMOS transistor MN53, which is connected to the first output node N51 of the differential amplification unit 51, forms a current mirror with the NMOS transistor MN51. Also, the driving unit 52 further includes a compensation capacitor (CC), which is connected to the drain and the gate of the NMOS transistor MN54.

The driving current control unit 54 includes an NMOS transistor MN55, having a gate to which the first output signal of the first output node n51 in the amplification is applied, a PMOS transistor MP56, having a gate to which the uniform bias voltage Vbias is applied, the drain is connected to the drain of the NMOS transistor MN55 through the drain node N54 and a PMOS transistor MP57, which the gate is connected to the drain node N54 of the PMOS transistor MP56 and the NMOS transistor MN55 and the drain is connected to the output node N53.

In the driving current control unit 54, the PMOS transistor MP57 is connected in series with the PMOS transistor MP55 for current sourcing and the gate of the PMOS transistor MP57 is connected to the drain node N54 of the PMOS transistor MP56 and the NMOS transistor MN55. When a current source operation of the output load 53 is performed, the PMOS transistor MP57 rapidly charges the output load 53 with the PMOS transistor MP55.

As the gate of the NMOS transistor MN54 for current sinking of the output load is connected to the second output node N52 that is the high gain node, the current sinking drivability is sufficient. The gate of the PMOS transistor MP55 is connected to the gate of the PMOS transistor MP54 through the node N55.

The NMOS transistor MN55 of the driving current control unit 54, which the gate is connected to the first output node N51, forms a current mirror with the NMOS transistor MN51 of the differential amplification unit 51. The size of the NMOS transistor MN51 is the same with the NMOS transistor MN55 and the size of the PMOS transistor MP53 is identical with the PMOS transistor MP56.

Figure 7:
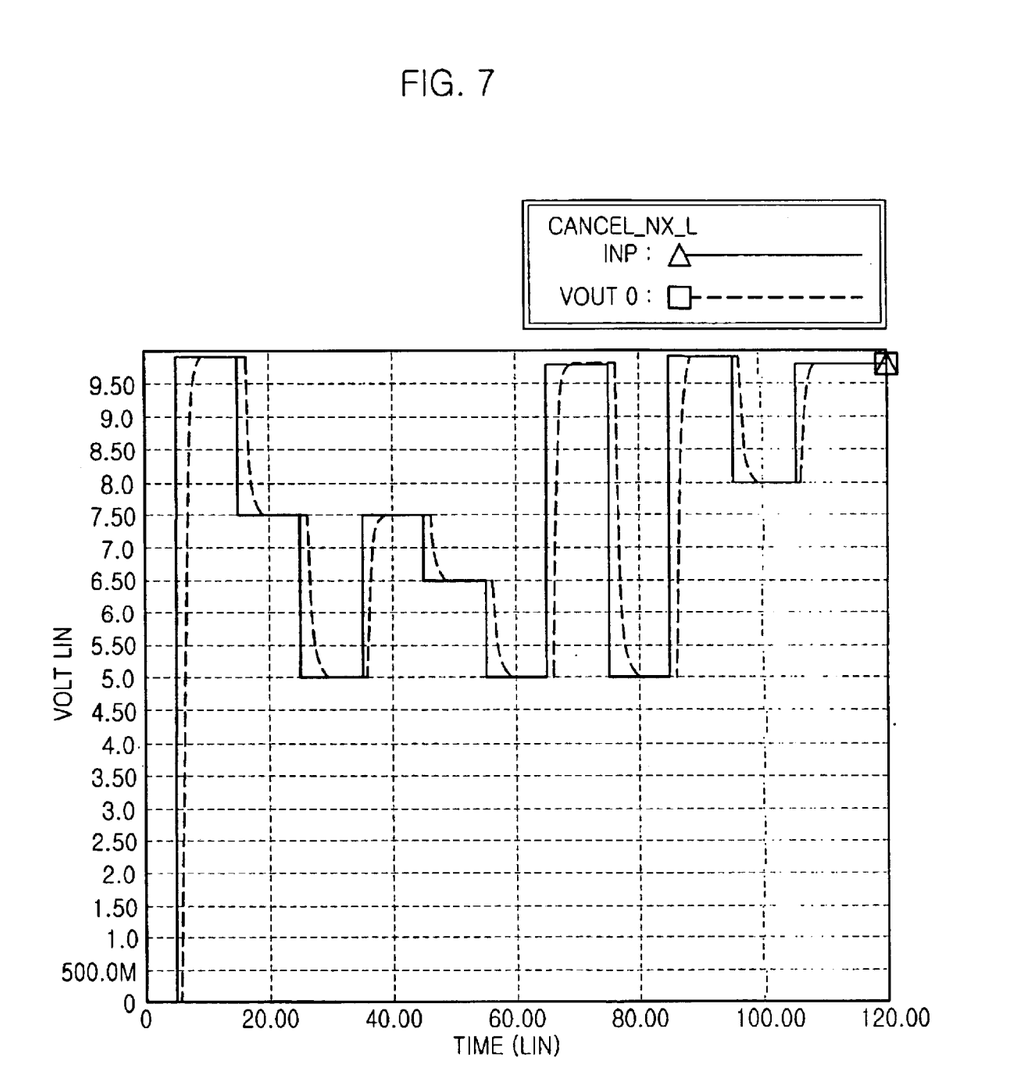
FIGS. 7 and 8 are graphic diagrams that depict simulation results of the operational transconductance amplifiers shown in FIGS. 4 and 6.
Figure 8:
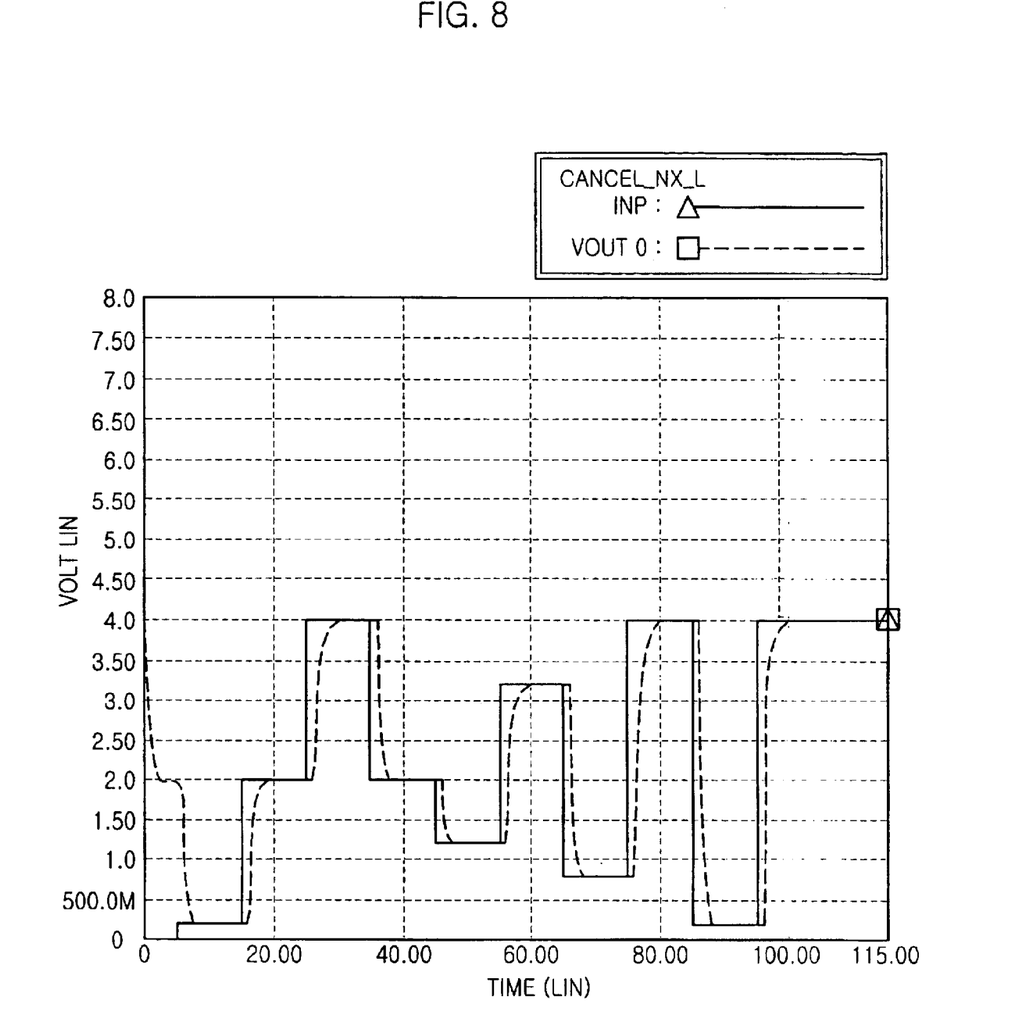

FIGS. 7 and 8 are exemplary graphic diagrams that depict simulation results of the operational transconductance amplifiers shown in FIGS. 4 and 6.

Figure 9:
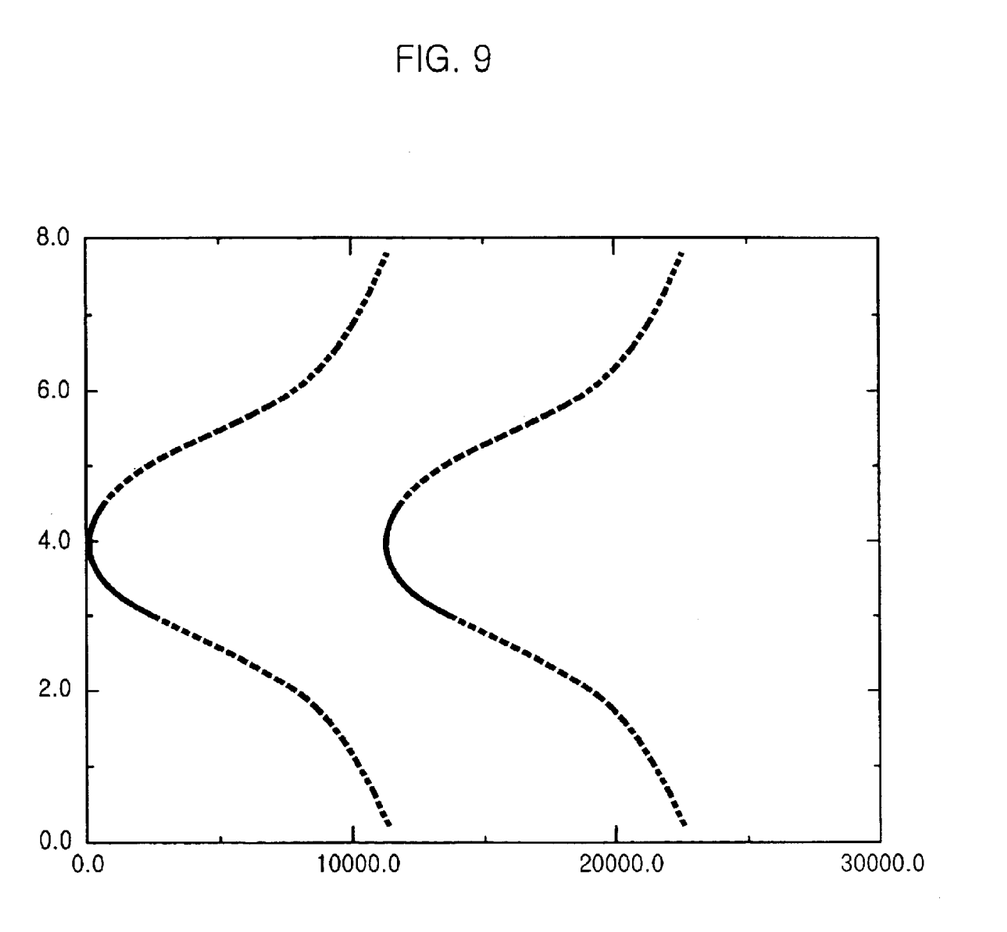
FIG. 9 is a graphic diagram showing an offset gamma characteristic.

FIG. 9 is an exemplary graphic diagram that depicts an offset gamma characteristic.

While the disclosure has been described with respect to the particular embodiments, it will be apparent to those skilled in the art that various changes and modifications may be made without departing from the spirit and scope of the disclosure as defined in the following claims.

What is claimed is:

1. An operational transconductance amplifier, comprising:
   a differential amplification unit adapted to generate first and second output signals at respective first and second output nodes by differentially amplifying first and second differential input signals;
   a driving unit including:
      a current sourcing unit and a current sinking unit, which are adapted to charge and discharge an output load in response to the first and second output signals, respectively; and
      a bias current supply unit adapted to supply bias current to the current sinking unit in response to the first output node in the differential amplification unit; and
   a driving current control unit adapted to control the driving current of the driving unit in response to the first output signal.

2. The operational transconductance amplifier as recited in claim 1, wherein the differential amplification unit includes:
   first and second PMOS transistors adapted to generate an active load;
   first and second NMOS transistors having respective first and second gates to which the first and second differential input signals are applied; and
   a third NMOS transistor adapted to supply a bias current to the first and second NMOS transistors.

3. The operational transconductance amplifier as recited in claim 2, wherein respective third and fourth gates of the first and second PMOS transistors are connected to a first drain of the first PMOS transistor and wherein respective first and second drains of the first and second PMOS transistors are connected to respective third and fourth drains of the first and second NMOS transistors through the respective first and second output nodes.

4. The operational transconductance amplifier as recited in claim 2, wherein the second output node of the differential amplification unit operates as a high gain node.

5. The operational transconductance amplifier as recited in claim 2, wherein the current sourcing unit includes a third PMOS transistor having a gate to which the second output signal is applied, a source connected to a power source and a drain.

6. The operational transconductance amplifier as recited in claim 2, wherein the current sinking unit is a fourth NMOS transistor having a gate to which the bias current from the bias current supplying unit is applied.

7. The operational transconductance amplifier as recited in claim 6, wherein the bias current supplying unit includes:
   a fourth PMOS transistor responsive to the first output signal of the first output node in the differential amplification unit; and
   a fifth NMOS transistor having a gate and a drain connected together as a diode, the drain of the fifth NMOS transistor connected to a drain of the fourth PMOS transistor and a source of the fifth NMOS transistor connected to a ground potential.

8. The operational transconductance amplifier as recited in claim 7, wherein the fourth PMOS transistor forms a current mirror with the first PMOS transistor.

9. The operational transconductance amplifier as recited in claim 8, wherein, in a quiescent state, a sinking current of the driving unit is determined by the sizes of the fourth and fifth NMOS transistors and the bias current.

10. The operational transconductance amplifier as recited in claim 9, wherein the driving current control unit includes:
    a fifth PMOS transistor having a gate to which the first output signal is applied, a source connected to a power source and a drain;
    a sixth NMOS transistor having a gate to which the bias voltage is applied; and
    a seventh NMOS transistor.

11. The operational transconductance amplifier as recited in claim 10, wherein the fifth PMOS transistor forms a current mirror with the first PMOS transistor.

12. The operational transconductance amplifier as recited in claim 10, wherein the size of the fifth PMOS transistor is substantially identical to the size of the first PMOS transistor.

13. The operational transconductance amplifier as recited in claim 10, wherein the size of the sixth NMOS transistor is substantially identical to the size of the third NMOS transistor.

14. The operational transconductance amplifier as recited in claim 10, wherein the seventh NMOS transistor is connected in parallel with the fourth NMOS transistor.

15. The operational transconductance amplifier as recited in claim 1, wherein the differential amplification unit includes:
    a first NMOS transistor and a second NMOS transistor adapted to generate active loads;
    a first PMOS transistor having a gate to which the first differential input signal is applied;
    and a second PMOS transistor having a gate to which the second differential input signal is applied; and
    a third PMOS transistor adapted to supply the bias current to the first and second PMOS transistors.

16. The operational transconductance amplifier as recited in claim 15, wherein the gates of the first and second NMOS transistors are connected to the drain of the first NMOS transistor, wherein a drain of the first PMOS transistor is connected to a drain of the first NMOS transistor through the first output node and wherein a drain of the second PMOS transistor is connected to a drain of the second NMOS transistor through the second output node.

17. The operational transconductance amplifier as recited in claim 16, wherein the second output node is operated as a high gain node.

18. The operational transconductance amplifier as recited in claim 16, wherein the driving unit includes:
   a current sinking unit adapted to discharge an output load;
   a current sourcing unit adapted to charge the output load; and
   a bias current supplying unit adapted to supply the bias current to the current sourcing unit in response to the first output signal.

19. The operational transconductance amplifier as recited in claim 18, wherein the current sinking unit includes a third NMOS transistor having a gate to which the second output signal is applied.

20. The operational transconductance amplifier as recited in claim 18, wherein the current sourcing unit includes a fourth PNMOS transistor having a gate to which the bias current from the bias current supplying unit is applied.

21. The operational transconductance amplifier as recited in claim 20, wherein the bias current supplying unit includes:
   a fourth NMOS transistor responsive to the first output signal; and
   a fifth PMOS transistor having a gate and a drain connected to a diode.

22. The operational transconductance amplifier as recited in claim 21, wherein the fourth NMOS transistor forms a current mirror with the first NMOS transistor.

23. The operational transconductance amplifier as recited in claim 21, wherein, in quiescent state, a sourcing current of the driving unit is determined by sizes of the fourth and fifth PMOS transistors.

24. The operational transconductance amplifier as recited in claim 22, wherein the driving current control unit includes:
   a fifth NMOS transistor having a gate to which the first output signal is applied;
   a sixth PMOS transistor having a gate to which the bias voltage is applied; and
   a seventh PMOS transistor.

25. The operational transconductance amplifier as recited in claim 24, wherein the fifth PMOS transistor forms a current mirror with the first NMOS transistor.

26. The operational transconductance amplifier as recited in claim 24, wherein the size of the fifth NMOS transistor is identical to the size of the first NMOS transistor in the differential amplification unit.

27. The operational transconductance amplifier as recited in claim 24, wherein the size of the sixth PMOS transistor is identical to the size of the third PMOS transistor in the differential amplification unit.

28. The operational transconductance amplifier as recited in claim 24, wherein the seventh PMOS transistor is connected in parallel with the fourth PMOS transistor for current sinking and is adapted to charge the output load with the fourth PMOS transistor.

29. An operational transconductance amplifier, comprising:
   a differential amplification unit adapted to differentially amplify first and second differential input signals and to output first and second output signals through respective first and a second output nodes;
   a driving unit adapted to charge or discharge an output load in response to the first and the second input signals; and
   a driving current control unit adapted to control a sinking current of the driving unit to discharge the output load in response to the first output signal.

30. An operational transconductance amplifier, comprising:
   a differential amplification unit adapted to differentially amplify first and second differential input signals and to output first and second output signals through respective first and second output nodes;
   a driving unit adapted to charge or discharge an output load in response to the first and the second input signals; and
   a driving current control unit adapted to control a sourcing current of the driving unit adapted to charge the output load in response to the first output signal.

* * * * *

UNITED STATES PATENT AND TRADEMARK OFFICE
CERTIFICATE OF CORRECTION

PATENT NO. : 6,727,753 B2
DATED : April 27, 2004
INVENTOR(S) : Hong-Shik Moon It is certified that error appears in the above-identified patent and that said Letters Patent is hereby corrected as shown below:

<u>Column 14,</u>
Line 22, please delete "and a second" and replace with -- and second --.
Line 36, please delete "input signals;" and replace with -- output signals; --.

Signed and Sealed this

Twenty-first Day of December, 2004

JON W. DUDAS
*Director of the United States Patent and Trademark Office*